US010162006B2

(12) United States Patent
Athimolom et al.

(10) Patent No.: US 10,162,006 B2
(45) Date of Patent: Dec. 25, 2018

(54) BOUNDARY SCAN TESTING A STORAGE DEVICE VIA SYSTEM MANAGEMENT BUS INTERFACE

(71) Applicant: Western Digital Technologies, Inc., San Jose, CA (US)

(72) Inventors: Gobinathan Athimolom, Sungai Petani (MY); Michael Rothberg, Foothill Ranch, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 14/689,043

(22) Filed: Apr. 16, 2015

(65) Prior Publication Data

US 2016/0306011 A1    Oct. 20, 2016

(51) Int. Cl.
| G01R 31/3185 | (2006.01) |
| G06F 11/27 | (2006.01) |
| G11C 29/06 | (2006.01) |
| G11C 29/32 | (2006.01) |
| G11C 29/56 | (2006.01) |

(52) U.S. Cl.
CPC ........... *G01R 31/318597* (2013.01); *G01R 31/318577* (2013.01); *G06F 11/27* (2013.01); *G11C 29/32* (2013.01); *G11C 29/56* (2013.01); *G11C 29/06* (2013.01)

(58) Field of Classification Search
CPC ........ G01R 31/318533; G01R 31/3177; G01R 31/388555; G01R 31/318572; G01R 31/2815

USPC .......................................................... 714/727
See application file for complete search history.

(56) References Cited

U.S. PATENT DOCUMENTS

| 6,151,693 A * | 11/2000 | Arnold ................... G11C 29/08 |
| | | 365/201 |
| 7,321,997 B2 * | 1/2008 | Zimmerman .......... G11C 29/54 |
| | | 714/718 |
| 7,802,155 B2 | 9/2010 | Hiew et al. |
| 7,873,885 B1 | 1/2011 | Shin et al. |
| 7,877,653 B2 * | 1/2011 | Whetsel ........... G01B 31/31855 |
| | | 714/727 |
| 7,944,225 B2 | 5/2011 | Kemmerling |
| 8,032,807 B2 * | 10/2011 | Iwami ............ G01R 31/318555 |
| | | 714/727 |
| 8,347,156 B2 | 1/2013 | Volkerink et al. |
| 8,718,967 B2 | 5/2014 | Filler |

(Continued)

OTHER PUBLICATIONS

Fan, Roger; "SMBus Quick Start Guide"; Application Note ANG4471; Freescale Semiconductor; Aug. 2012; 16 pages.

(Continued)

*Primary Examiner* — James C Kerveros
(74) *Attorney, Agent, or Firm* — Patterson & Sheridan, LLP; Steven Versteeg (57) ABSTRACT

A system and method are provided for boundary scan testing one or more digital data storage drives. In particular, a drive tester system connects to the one or more digital data storage drives via a standard two-wire interface, such as a system management bus (SMBus) interface. The drive tester system performs a boundary scan test on the on more digital data storage drives via the standard two-wire interface. The boundary scan test may include a vector test.

16 Claims, 7 Drawing Sheets

(56) References Cited

U.S. PATENT DOCUMENTS

| | | | | |
|---|---|---|---|---|
| 9,037,928 B2* | 5/2015 | Kleveland | ............... | G11C 29/44 |
| | | | | 714/710 |
| 2007/0061646 A1* | 3/2007 | Whetsel | ......... | G01R 31/318572 |
| | | | | 714/726 |
| 2009/0249143 A1* | 10/2009 | Iwami | .............. | G01R 31/31855 |
| | | | | 714/726 |
| 2013/0108065 A1* | 5/2013 | Mullins | ............ | G01R 31/31701 |
| | | | | 381/58 |
| 2013/0124932 A1 | 5/2013 | Schuh et al. | | |
| 2013/0173970 A1* | 7/2013 | Kleveland | ............... | G11C 29/44 |
| | | | | 714/710 |
| 2016/0116535 A1* | 4/2016 | Swoboda | ......... | G01R 31/31727 |
| | | | | 714/727 |

OTHER PUBLICATIONS

Flexstar Technology; "SSC Testing Systems"; http://flexstar.com/products-page/ssd-testing; Jan. 18 2014; 5 pages.

Flexstar Technology; "F-300B PCIe SSD Production Test System"; Aug. 27, 2014; 2 pages.

* cited by examiner

BOUNDARY SCAN TESTING A STORAGE DEVICE VIA SYSTEM MANAGEMENT BUS INTERFACE

FIELD

The embodiments relate generally to boundary scan testing a storage device via a system management bus (SMB) interface.

BACKGROUND

Typical solid state drive (SSD) manufacturing process begins with surface-mount technology (SMT) mounting of electronic components on the printed circuit (PC) board(s). Each PC board is then board-level verified by "interconnection testing" using techniques such as in-circuit test (ICT) or flying probe testing, before the subassemblies are assemble into a drive. Such a drive is typically in the form of a Peripheral Component Interconnect Express (PCIe) Card Edge or a small form factor (SFF) "drive".

Once the drive is assembled, the drive needs to be initialized before board-level testing can begin at the factory. An "out of band" interface, not dependent on the device's firmware, is typically used to initialize the drive at the factory. A typical 'out of band" interface used for the initialization is a universal asynchronous receiver/transceiver (UART) or a high-speed serial interface (HSSI), having a speed that is typically between 19.2 kbps to 1 Mbps).

In a full system slot (e.g., where the drive sits in a fully functional environment and expected to operate fully, including the standard product interface, and host software stack), firmware is typically required to use the standard product interface, such as serial attached small computer system interface (SAS), serial advanced technology attachment (SATA), or PCIe.

BRIEF SUMMARY

The embodiments are summarized by the claims that follow below. However, briefly, a system and method for boundary scan testing one or more digital data storage drives are described. In particular, a drive tester system connects to the one or more digital data storage drives via a serial two-wire interface, such as a system management bus (SM-Bus) interface. The drive tester system performs a boundary scan test on the on more digital data storage drives via the serial two-wire interface. The boundary scan test may include a vector test.

BRIEF DESCRIPTIONS OF THE DRAWINGS

Various embodiments are illustrated by way of example, and not by way of limitation, in the figures, which are briefly described below.

It will be recognized that some or all of the Figures are for purposes of illustration and do not necessarily depict the actual relative sizes or locations of the elements shown. The Figures are provided for the purpose of illustrating one or more embodiments with the explicit understanding that they will not be used to limit the scope or the meaning of the claims.

DETAILED DESCRIPTION

In the following detailed description of the embodiments, numerous specific details are set forth. However, it will be obvious to one skilled in the art that the embodiments may be practiced without these specific details. In other instances well known methods, procedures, components, and circuits have not been described in detail so as not to unnecessarily obscure aspects of the embodiments.

System Overview

Figure 1A:
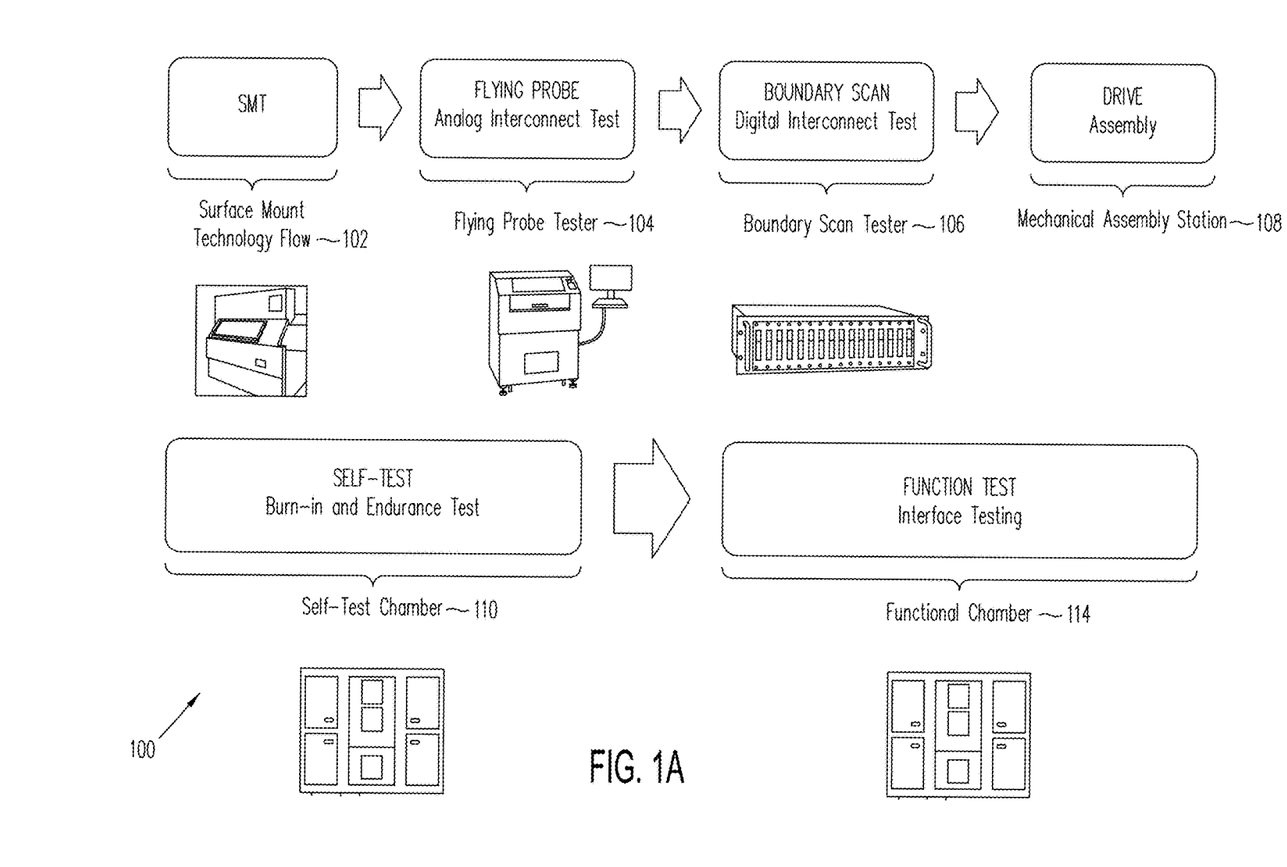
FIG. 1A is a high-level block diagram of a system for manufacturing and testing drives, such as solid state drives (SSDs) or hard disk drives (HDDs).

FIG. 1A illustrates a high-level block diagram of a system 100 for manufacturing and testing digital data storage drives, such as solid state drives (SSDs) or hard disk drives (HDDs).

Figure 6:
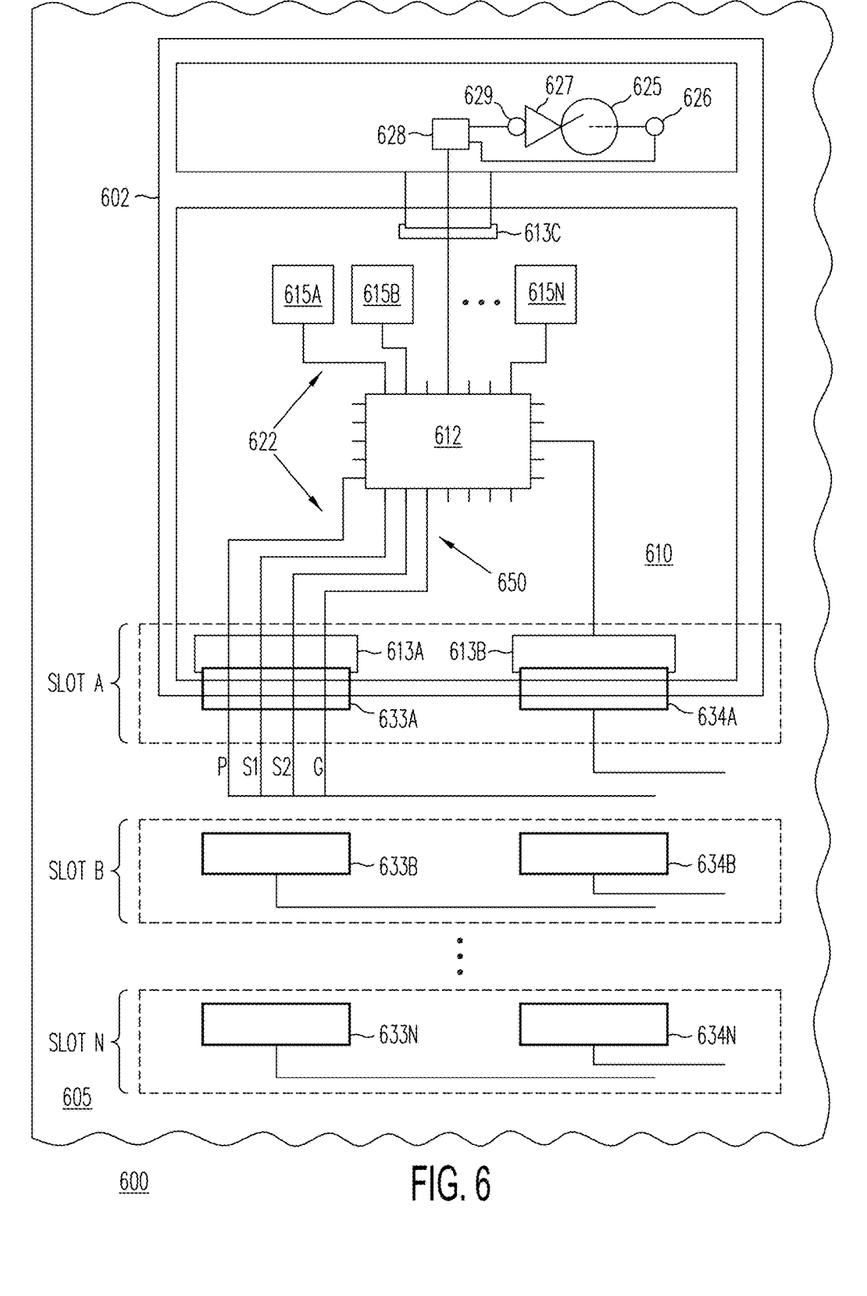
FIG. 6 is a block diagram of a digital data storage drive mounted in a tester system.

FIG. 6 illustrates a block diagram of a digital data storage drive 602 mounted in a test system 600. The digital data storage drive 602 includes a printed circuit board (PCB) 610 with a controller integrated circuit 612, one or more connectors 613A-613C, and one or more storage integrated circuits 615A-615N mounted to the PCB. The controller integrated circuit 612 and the one or more storage integrated circuits 615A-615N may be surface mounted to the PCB. The printed circuit board 612 includes a plurality of wire traces 622 that electrically couple together the controller integrated circuit 612, the one or more connectors 613A-613C, and the one or more storage integrated circuits 615A-615N.

In the case of a solid state drive, the one or more storage integrated circuits 615A-615N of the digital data storage drive 602 are read-writeable non-volatile memory integrated circuits, such as flash electrically erasable programmable read only memory (EEPROM). In the case of a hard disk drive, the digital data storage drive 602 may further include an electromechanical magnetic disk drive 625, a drive motor 626, read/write heads 627, drive electronic circuit 628 and head motor 629 coupled to the printed circuit board 610 and the controller 612 through the connector 613C.

In any case, it is desirable to test a plurality of digital data storage drives 602 mounted in the test system 600. Accordingly, the test system 600 includes a printed circuit board 605 with a plurality of connectors 633A-633N to interface with the connector 613A of each drive.

Referring now to FIGS. 1A and 6, electronic circuits (e.g., circuit 612, 615A-615N) of digital data storage drives are often manufactured in part with a surface-mount technology (SMT) flow 102. The surface-mount technology (SMT) flow 102 produces electronic circuits having components that are mounted or placed directly onto the surface of printed circuit (PC) boards (e.g., PCB 610) often with PCB contacts underneath the part. An electronic device so mounted may be referred to as a surface-mount device (SMD). With surface-mount technology (SMT), it may be difficult to access test points for electronic circuits so mounted to fully test each component after mounting.

A flying probe tester 104 is used to test basic production, prototypes, and PC boards that present accessibility problems. The flying probe tester 104 uses electro-mechanically controlled probes to access electronic components mounted on printed circuit assemblies (PCAs). Commonly used for testing analog circuit components, analog signature analysis, and short/open circuits, the flying probe tester 104 can be classified as an in-circuit test (ICT) system or as a Manufacturing Defects Analyzer (MDA).

A boundary scan tester 106 can test interconnects (e.g., nets, or wire traces 622, etc.) on printed circuit boards (e.g., PCB 610) between mounted integrated circuits (e.g., integrated circuits 612, 615A-615N) and circuits (e.g., integrated circuit 612) and connectors (e.g., 613A-615C). The boundary scan tester 106 can also test peripheral circuits and input, output, input/output circuit blocks and other functional blocks inside an integrated circuit (e.g., circuits 612, 615A-615N). For example, a boundary scan tester 106 can debug integrated circuit pin states, measure voltage, or analyze sub-blocks inside an integrated circuit.

A Joint Test Action Group (JTAG) test interface 650 is the common name for the IEEE 1149.1 Standard Test Access Port and Boundary-Scan Architecture test interface. The JTAG test interface was initially devised by electronic engineers for testing printed circuit boards using boundary scan and is still widely used for this application. The JTAG interface is also widely used as debug ports for integrated circuits. In the embedded processor market, essentially all modern processors implement JTAG if they have enough pins within a pinout. The JTAG standard has been adopted by electronic device companies all over the world. Boundary scan testing is typically synonymous with the JTAG interface 650.

With the electrical components initially tested, a mechanical assembly station 108 Is used to assemble one or more of the mechanical components, the electrical components and the electro-mechanical components of a drive together. Solid state drives tend to have fewer mechanical and electro-mechanical components requiring assembly.

Next, a self-test chamber 110 is used to perform a burn-in and endurance test for one or more storage drives 602. For example, the self-test chamber 110 may be used to perform a built-in self-test (BIST) or built-in test (BIT) on a drive at or above a temperature and a power supply voltage over a period of time. The BIST or BIT is a mechanism or process that permits a drive to test itself. Engineers design BISTs to meet requirements (e.g., high reliability, lower repair cycle times, etc.) or constraints (e.g., limited technician accessibility, cost of testing during manufacture, etc.). BIST can reduce cost in at least two ways: (1) by reducing test-cycle duration and/or (2) reducing the complexity of the test/probe setup, by reducing the number of I/O signals that must be driven/examined under tester control. Both can lead to a reduction in hourly charges of an automated test equipment (ATE) service that would otherwise be used to test a drive. The self-test chamber 110 is further discussed below with reference to FIGS. 2-4.

Figure 2:
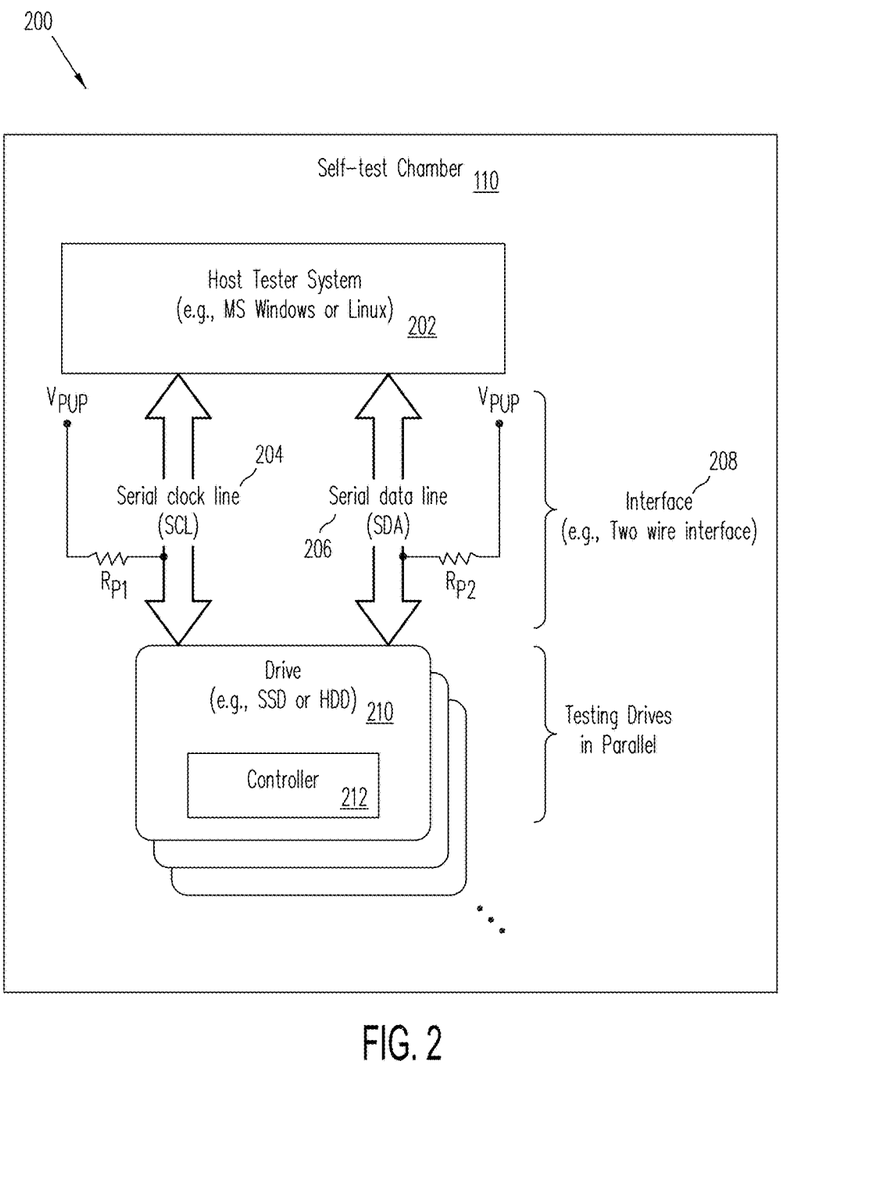
FIG. 2 is a conceptual block diagram of a drive tester system, which includes a self-test chamber in this example.

A burn-in and endurance test for new storage drives provides a stress test (whether highly systematic or less formal) in which the storage drives that are doomed to fail early in life can either do so before the storage drives are in use, or give strong indications that the storage drives will fail in the near future. There are at least two ways to carry out a burn-in and endurance test. In one way, the drive tester system 200 can use a disk utility program or specialized burn-in utility program to run a proprietary heavy-load test on your new drive(s). Such utility programs will either cause a doomed drive to fail, or provide diagnostic feedback that will predict early failure. In another way, the drive tester system 200 can carry out an informal use-specific test. For example, the drive tester system 200 can fill a disk of a storage drive to about 60% capacity, and then create a high track count, edit-dense session with a long duration (e.g., on a digital audio workstation (DAW)). The storage drive(s) are left in a loop playback for 12 or more hours. The storage drive and drive tester system catalogs some important diagnostic information that can help predict early failure of a storage drive.

A functional chamber 114 may then be used to perform a function testing of a storage drive 602 through a storage drive's standard product interface (e.g., serial attached SCSI (SAS) drive interface, serial advanced technology attachment (SATA) drive interface, or peripheral component interconnect—express (PCIe) local computer bus interface) such as may be available at connector 613B. The functional testing of a storage drive is performed on the printed circuit board 610, the electronic circuits 612, 615A-615N mounted thereto, and any electro-mechanical components 625-629 at a board level. Chip level testing of integrated circuit chips 612, 615A-615N is typically performed by a semiconductor manufacturer before receipt and assembly of a storage drive by the storage drive manufacturer. Board level testing of the integrated circuit chips 612, 615A-615N is typically performed with self tests during a self testing mode.

Board-level testing typically uses two test slots (e.g., configurations) to interface to a storage drive: the "full system slot" and the "serial interface slot" (e.g., where the standard interface is not present). The "serial interface slot" is typically more compact and less expensive to produce than the "full system slot". The "full system slot" requires full standard interface electronics and sufficient computer horse power (e.g., in a full system environment around the drive)) to test a storage drive. Using a "full system slot" to test a storage drive is more expensive than using a "serial interface slot".

The "serial interface slot" has just enough computing power to download, launch, and monitor a storage drive during self-test through a serial interface. Once the drive firmware and self-test code is loaded onto the drive, the drive can proceed with self testing in a self-test mode. Data traffic is limited over the slower serial interface. The data traffic is used to monitor the self-test progress, and to get final test results. During self testing, component functional testing is performed, and NAND Flash testing and burn-in is performed. Once self-test is complete, the drive can be moved to a "full system slot" to complete drive-level functional testing, interface testing. Drive performance testing is performed (e.g., just enough to establish high-level drive operation). Typically, 80 to 90% of the testing is done in self-test mode in the "serial interface slot", the remainder being done in the "full system slot".

Early test processes may have used different stations for firmware download, self-test, and functional testing with different serial interfaces. Another solution for test processes is to use a custom serial interface with a non-standard interface connector. However, a custom connector does not work for PCIe/SFF products with integrated testers. It is desirable to use a single station with "serial interface slot" firmware download during self-test. As further described below, the system carries out testing via a System Management Bus (SMBus).

Figure 1B:
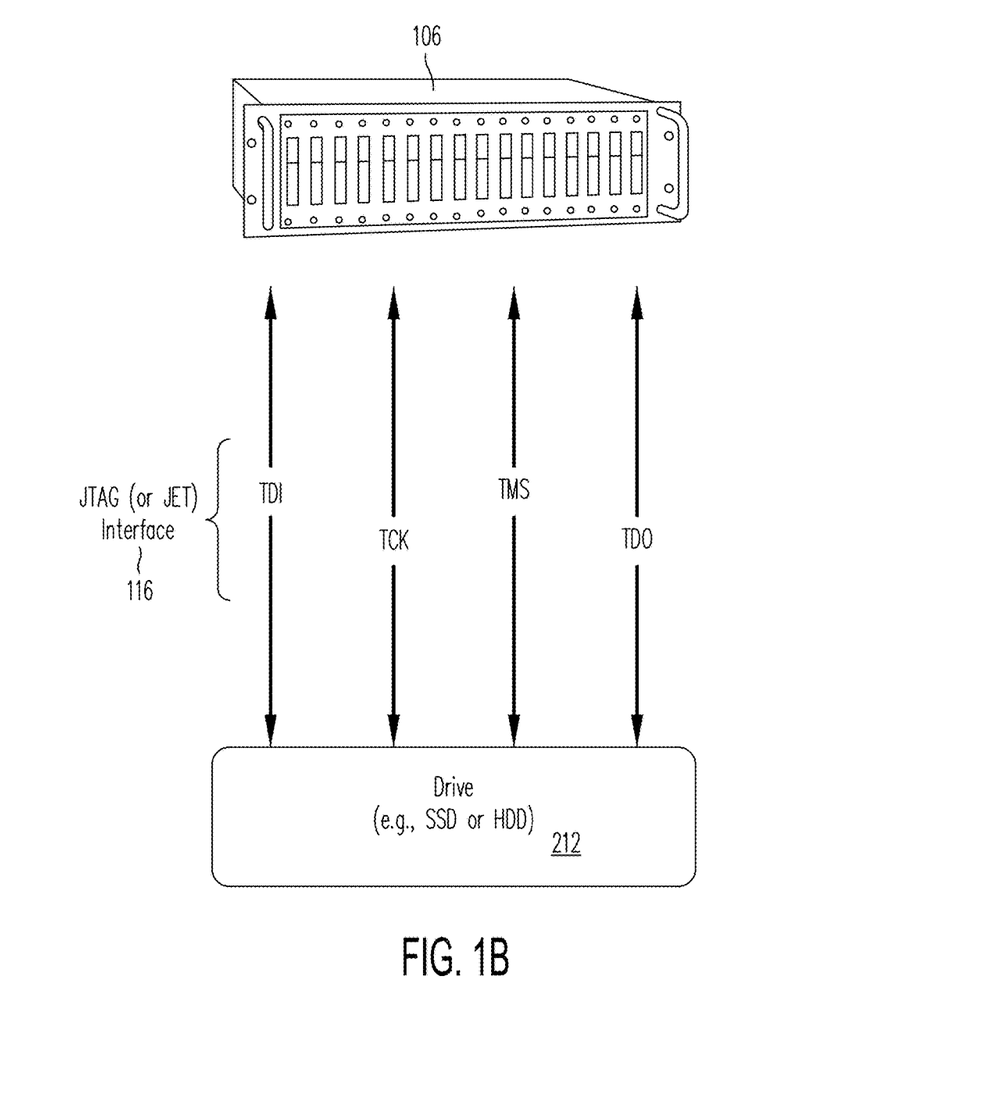
FIG. 1B is a conceptual block diagram of the boundary scan tester of FIG. 1.

Referring now to FIG. 1B, a conceptual block diagram of the boundary scan tester 106 of FIG. 1 is illustrated. The boundary scan tester 106 is coupled to a digital data storage drive 210 via a JTAG interface/JTAG Embedded Test (JET) interface 116. The digital data storage drive (210,602) is further discussed herein with reference to FIGS. 2 and 6.

As shown in FIG. 1B, the JTAG/JET interface 116 includes four connector pins: Test Data In (TDI), Test Data Out (TDO), Test Clock (TCK), and Test Mode Select (TMS). In many ICs today, pins that connect to electronic logic of an integrated circuit can be selectively linked together in a set called a Boundary Scan chain when the IC is in a test mode. By using JTAG/JET interface to select the chip's external interface (inputs and outputs to other chips) into a boundary scan chain, the boundary scan tester 106 can test for certain faults, such as those that may caused by manufacturing or assembly problems.

On chip test registers are also often provided in integrated circuits to convert serial signals off chip to parallel signals on chip; covert parallel signals on chip to serial signals off chip; and support testing the internal logic of an integrated circuit when in a test mode. By using JTAG/JET interface to select the on-chip test registers; input test vectors can be serially shifted in and coupled to inputs of the chip's internal combinational logic so they can be tested with output test results serially sent out of the chip from on-chip test registers.

In both cases of using the JTAG/JET interface, testing is done with the IC after it is mounted on the printed circuit board. Upon initialization, the JTAG/JET interface is often used to test integrated circuits for faults in a functioning system. When combined with built-in self-testing (BIST), the JTAG scan chain enables a low overhead, embedded solution to testing an IC for certain static faults (shorts, opens, and logic errors). The ability to perform such testing on finished printed circuit boards is an important part of IC design techniques that design systems for testing by adding certain testability features to a hardware product design (e.g., "Design For Test"). Designing a JTAG/JET interface 116 into a storage drive may increase the number of faults that can be found before storage drive product are finally shipped to customers.

The JTAG/JET interface 116 is a usually a special interface added to a chip. Four test pins are typically added as shown. A test probe need only connect to a single JTAG port to have access to all chips on a circuit board. In another embodiment, the system 100 can carry out a JTAG Embedded Test (JET), instead of normal JTAG testing, by using a JTAG/JET interface 116 of a storage drive (210,602).

As further described below, a modified testing system includes an interface that emulates the JTAG/JET interface 116 in order to simplify the system 100 and test digital data storage drives and the integrated circuits therein with a JTAG/JET interface 116.

Drive Testing via System Management Bus (SMBus) Interface

Figure 1C:
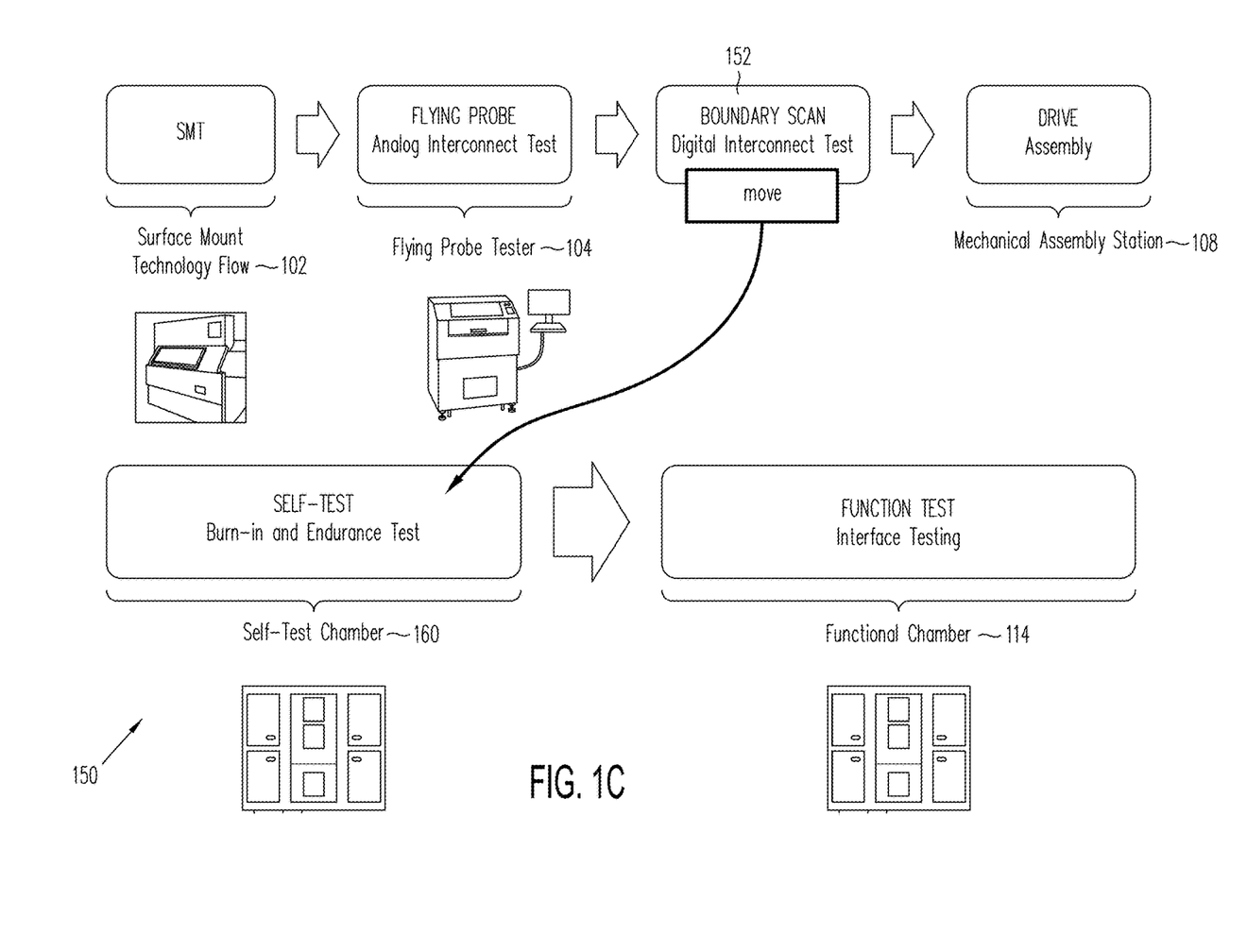
FIG. 1C is a modified system, which is similar to the system of FIG. 1A with some modifications.

FIG. 1C is a modified system 150, which is similar to the system 100 of FIG. 1A with some modifications. For simplicity, portions of the modified system 150 that are substantially similar to the system 100 are not discussed repeatedly here.

The system 100 is modified into the modified system 150 by moving the process of boundary scan testing 152 by a boundary scan tester to the self-test chamber 160. An interface is provided that emulates a JTAG interface and reduces the overall number of interfaces and protocols required for testing a storage drive. In particular, the interface for the boundary scan testing is compatible with the interface used in the self-test chamber 160. Accordingly, boundary scan testing 152 by the boundary scan tester 106 can be can be moved to be concurrently performed during self test with the self-test chamber 160. A dedicated boundary scan tester 106 is thereby essentially eliminated in the modified testing system. The modified system 150 can then carry out boundary scan testing 152 as well as self testing in the self-test chamber 160. Thus, the modified system 150 saves capital costs, factory time, and handling required to manufacture and test a digital data storage drive.

For example, the host tester system 202 can carry out boundary scan testing 152 via the two wire interface 208 shown in FIG. 2, which is further described herein. The two wire interface 208, which is used for also self-testing, is the same interface that the host tester system 202 can use for boundary scan testing 152. Boundary scan testing is described herein with reference to FIG. 1A. In particular, boundary scan testing can debug integrated circuit pin states, and analyze input, output, and input/output sub-blocks inside an integrated circuit.

FIG. 2 illustrates a conceptual block diagram of a drive tester system 200, which includes a self-test chamber 110 in this example. Self-test chamber 110 includes (or is connected to) host tester system 202, an interface 208, and at least one digital data storage drive 210. Host tester system 202 is coupled to the one or more drives 210 in slot A through slot N using the interface 208. The interface 208 may be made between connector 613A and 633A shown in FIG. 6. Host tester system 202 may include a general purpose computer (e.g., workstation or desktop computer) having an operating system such as, for example, Microsoft Windows or Linus. Drive 210 is a digital data storage drive that may be implemented, for example, as an SSD or an HDD. In the example of FIG. 2, drive 210 includes a controller 212.

Host tester system 202 can test multiple storage drives 210,602 in parallel over the interface 208, while communicating individually with each drive. If host tester system 202 detects a fault (e.g., short, soldering problem, open circuit, etc.) on one of the multiple drives, then the faulty drive can be removed individually while host tester system 202 continues to test other drives that are not detected to be faulty.

The Interface 208 may include a power line P and a ground line G such as shown in FIG. 6. Data communication over the Interface 208 may include a two wire interface (TWI) and/or a two wire bus, in which two standard wire connections (S1,S2 shown in FIG. 6) couple host tester system 202 to drive 210. In one embodiment, interface 208 includes an Inter-Integrated circuit (I$^2$C) serial computer bus interface, instead of a universal asynchronous receiver/transceiver (UART) interface or a high-speed serial interface (HSSI). The Inter-Integrated circuit (I$^2$C) serial computer bus interface uses only two bidirectional serial lines, a Serial Data Line (SDA) 206 and a Serial Clock Line (SCL) 204 (serial lines S1 and S2 shown in FIG. 6) to serially communicate to the circuits coupled to it. The circuits are addressed by an N bit address space (e.g., 7 or 10 bit) for them to receive and act on a command or message. The two-wire lines have pull-up resistors (e.g., $R_{p1}$ and $R_{p2}$ shown in FIG. 2) to coupled to them and pull up voltages (e.g., $V_{pup}$ shown in FIG. 2) so that they can be driven by open drain and/or open collector transistor outputs to ground in a wired-OR configuration.

In another embodiment, interface 208 includes a system management bus (SMBus) interface, instead of a Universal Asynchronous Receiver/Transmitter (UART) or a High- Speed Serial Interface (HSSI). SMBus is a two-wire data connection having SMBDAT and SMBCLK lines (e.g., serial S1 and S2). The two-wire lines have pull-up resistors coupled to them so that they can be driven by open drain and/or open collector transistor outputs to ground in a wired-OR configuration. SMBus is a subset of I²C that defines communication protocols and signal timing/frequency a little more strictly. One purpose of SMBus is to promote robustness and interoperability between electronic circuits (e.g., circuits 612, 615A-615N). Accordingly, a modern I²C interface incorporates policies and rules from SMBus, sometimes supporting both I²C and SMBus, requiring only minimal reconfiguration to support either or both.

In one embodiment, the host tester system 202 uses an SMBus interface and/or I²C interface directly as a medium-speed serial interface. Accordingly, the interface 208 can easily perform all the duties of UART or HSSI. Further, SMBus and/or I²C has the ability to address different port locations and issue different commands to the drive 210,602. Accordingly, the different ports and commands enable much more functionality and flexibility to drive-level testing of the storage drive (as compared to UART or HSSI). The additional functionality and flexibility is apparent during component testing of drive, even before the system has installed product firmware into the drive 210,602. Thus, using SMBus and/or I²C provides a broad range of capabilities more than using UART.

To handle a PCIe protocol or a non-volatile memory express (NVMe) protocol, pins for an SMBus interface are already allocated on a standard connector for those protocols. For example, the host tester system 202 may use a standard Edge Card connector or a standard small form factor (SFF) connector to read vital product data (VPD) from the storage drive 210.

For other interface protocols (e.g., Advanced Host Controller Interface (MCI), proprietary PCIe, SCSI, SAS, or SATA), host tester system 202 uses reserved pins for multiplexing of already-used pins. However, after the host tester system 202 establishes a mechanical and electrical interconnect to drive 210, the host tester system 202 can use any of these protocols and often on the same slot (e.g., slot A shown in FIG. 6). The host tester system 202 can then use generic test code, generic sequence, and/or generic software. Accordingly, the host tester system 202 can bypass a custom front-end interface portion of the storage drive 210. Such ability to bypass enables more commonality of host tester resources for software development and/or for useable code.

Figure 3:
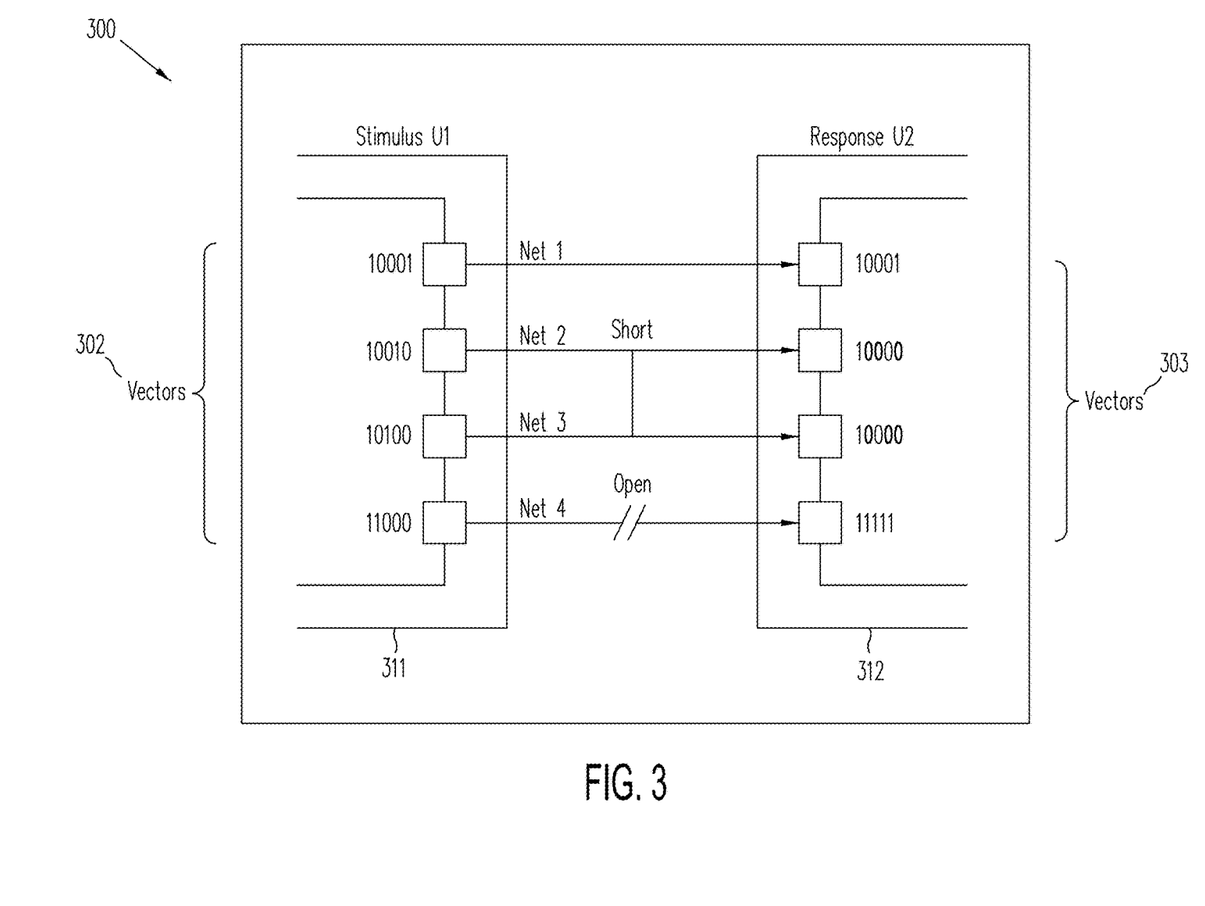
FIG. 3 is a schematic diagram of an example boundary scan test.

Referring now to FIG. 3, a schematic diagram of an example boundary scan test 300 is shown. Boundary-scan cells within an integrated circuit can be configured to support external testing for interconnection between chips (e.g., EXTEST instruction) or internal testing for logic within the chip (e.g., INTEST instruction).

Boundary scan testing involves a number of boundary scan test vectors. The example boundary scan test 300 includes input test vectors 302 and output result vectors 303 at pairs of pins of integrated circuits 311,312 between wire interconnections of nets (Net 1 through Net 4). Each vector may be communicated using a Serial Vector Format (SVF) or a similar serial data interchange.

During the testing, output signals representing input test vectors are generated by an IC chip 311. It is expected that the output signals be received by boundary-scan cells in the IC chip 212 if there is nothing wrong with the input and output ports of the chips or the nets between pins. If something is wrong, one or more output signals will not reach the boundary-scan cells in the IC chip 212 and not meet the expected resultant vector.

The example of FIG. 3 shows only a portion of the IC chips 311 and 312. An actual drive may include hundreds or thousands of nets that the host test system 202 can test. Further, the host test system 202 may test hundreds or thousands of drives at a time in parallel, while communicating with each drive independently.

For explanatory purposes, the boundary scan test 300 shows a stimulus U1 over four nets, including Net 1, Net 2, Net 3, and Net 4. The boundary scan test 300 identifies a response U2, which includes output vectors 303 that are associated with the input vectors 302. Each of the input vectors 302 drives some signals onto the four nets. Each of the associated output vectors 303 is used to determine whether or not the output responses are as expected. The output vectors 303 should be equivalent to the corresponding input vectors 302 (e.g., the vectors for net 1). If not, the host tester system 202 may identify a net having a short circuit, an open circuit, or some other type of fault. In this example, net 2 and net 3 have a short, while net 4 has an open circuit. Accordingly the system 150 can recognize the faults (shorts and open circuits), remove the faulty storage drive from further testing, and then repair or discard the faulty storage drive.

Figure 4:
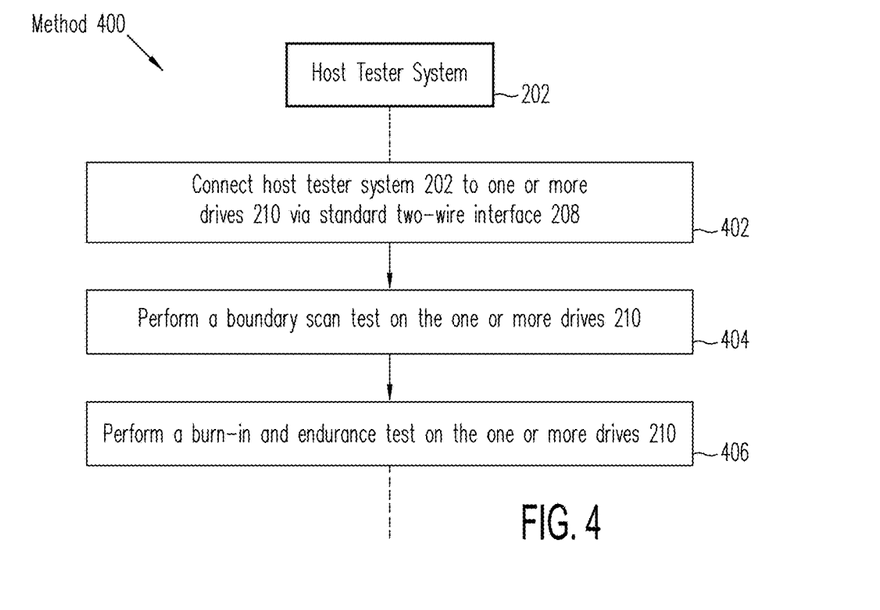
FIG. 4 is a flow chart of an example method for boundary scan testing of a digital data storage drive.

Referring now to FIG. 4, a flow chart of an example method 400 for boundary scan testing a digital data storage drive is illustrated. In one embodiment, the drive tester system 200 of FIG. 2 can carry out the example boundary scan testing method 400.

At action 402, one or more drives 210 are coupled to the host tester system 202 in the drive tester system 200 via a standard two-wire interface 208. As described herein, the interface 208 may include an I²C interface and/or an SMBus interface.

At action 404, the drive tester system 200 performs a boundary scan test on the printed circuit board and electronic circuits mounted thereto of one or more drives 210. The boundary scan test may include, for example, the boundary scan test described herein with reference to FIG. 3.

At action 406, the drive tester system 200 initiates another drive test via the interface 208. The further drive tests performed on the storage drive 210 may include, for example, a burn-in and endurance test as described herein with reference to FIG. 1.

Other actions and/or details that are discussed with reference to other figures and may be a part of the method 400, depending upon the implementation.

Computer Apparatus

Figure 5:
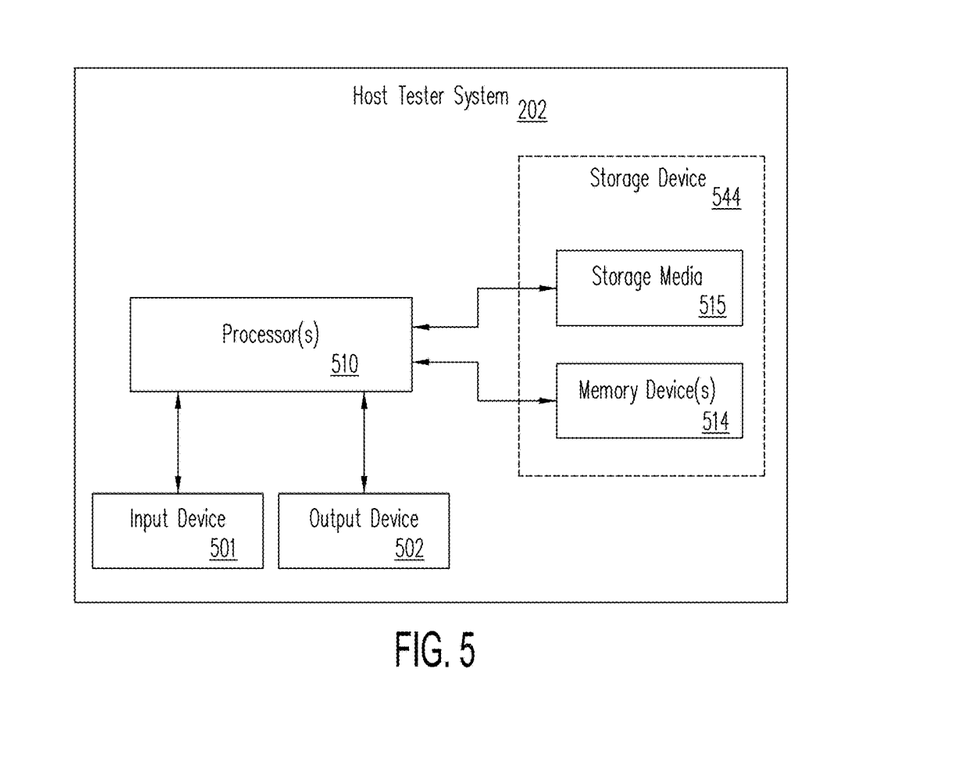
FIG. 5 is a block diagram showing a computer apparatus implementation of the host tester system of FIG. 2.

FIG. 5 is a block diagram showing a computer apparatus implementation of the host tester system 202 shown in FIG. 2. The host tester system 202 may be implemented in part by a desktop computer, a workstation, or a laptop computer, among other devices.

In the example of FIG. 5, the host tester system 202 includes an input device 501 (e.g., keyboard, mouse, Ethernet or other communications port), an output device 502 (e.g., monitor, speakers, printer, communications port, or a writeable media drive), one or more processors 510, and a storage device 544 coupled together as shown. The storage device 544 may include storage media 515 and one or more memory devices 514 (e.g., ROM, RAM, EEPROM, flash memory and/or other memory building blocks). The storage media 515 is configured to store data in a non-volatile manner such as in a non-volatile memory, a hard disk drive, a solid-state drive, and the like. In some embodiments, as is known in the art, storage media 515 may be located on another computing device across a network. Instructions may be loaded from storage media 544 into the one or more memory devices 514. The one or more processors 510 may retrieve instructions from the storage media 515 or the one or more memory devices 514 and execute the instructions to perform the operations described herein.

Included in the one or more memory devices 514 or storage media 515 is a set of processor executable instructions that, when executed by the one or more processors 510 configures the computing apparatus to control the host tester system 202 in a manner consistent with the methods disclosed herein. A user interface for controlling the host tester system 202 may be displayed by the output device 502 in response to processor or machine readable instructions.

The one or processors 510 execute instructions stored in a non-transitory machine-readable memory or storage device, such as the one or more memory devices 514, the storage media 544, or a removable storage device (e.g., at least one of an optical medium, a compact disk (CD), a digital video disk (DVD), a magnetic medium, magnetic disk, or a magnetic tape, etc.).

When implemented in software, the elements of the embodiments of the invention are essentially the program, code segments, or instructions to perform the necessary tasks. The program, code segments, or instructions can be stored in a processor readable medium or storage device that can be read and executed by a processor. The processor readable medium may include any medium that can store information. Examples of the processor readable medium include, without limitation, an electronic circuit, a semiconductor memory device, a read only memory (ROM), a flash memory, an erasable programmable read only memory (EPROM), a floppy diskette, a CD-ROM, an optical disk, and a magnetic disk. The program or code segments may be downloaded via computer networks such as the Internet, Intranet, etc. and stored in the processor readable medium or storage device.

Some portions of the preceding detailed description may have been presented in terms of algorithms and symbolic representations that perform operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities may take the form of electrical (e.g., current or voltage) or magnetic signals capable of being stored, transferred, combined, compared, and otherwise manipulated. It has proven convenient at times, principally for reasons of common usage, to refer to these signals as bits, values, levels, elements, symbols, characters, terms, numbers, or the like.

However, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, processing logic, or similar electronic computing device, that automatically or semi-automatically manipulates and transforms data represented as physical (electronic) quantities within the computer system's registers and memories into other data similarly represented as physical quantities within the computer system memories or registers or other such information storage, transmission or display devices.

Additionally, the embodiments of the invention are not described with reference to any particular programming language. It will be appreciated that a variety of programming languages may be used to implement the teachings of the embodiments of the invention as described herein.

CONCLUSION

A system and method for boundary scan testing one or more digital data storage drives are described. In particular, a drive tester system connects to the one or more digital data storage drives via a standard two-wire interface, such as a system management bus (SMBus) interface. The drive tester system performs a boundary scan test on the one or more digital data storage drives via a two-wire interface. The boundary scan test may include a boundary scan vector test.

It will be appreciated that the embodiments of the invention can be practiced by other means than that of the above-described embodiments, which are presented in this description for purposes of illustration and not of limitation. The specification and drawings are not intended to limit the exclusionary scope of this patent document. It is noted that various equivalents for the particular embodiments discussed in this description may be practice by the claimed invention as well. That is, while specific embodiments of the invention have been described, it is evident that many alternatives, modifications, permutations and variations will become apparent in light of the foregoing description. Accordingly, it is intended that the claimed invention embrace all such alternatives, modifications and variations as fall within the scope of the appended claims. The fact that a product, process, or method exhibits differences from one or more of the above-described exemplary embodiments does not mean that the product or process is outside the scope (literal scope and/or other legally-recognized scope) of the following claims.

What is claimed is:

1. A drive tester system, comprising:
   a digital data storage drive including one or more integrated circuits having at least one pair of pins connected via an interconnect;
   a system management bus (SMBus) interface having two wire connections with at least one pull-up resistor coupled to each of the wire connections and wherein the pull up resistors are configured to be driven by one of an open drain and open collector transistor output; and
   a host tester system coupled to the digital data storage drive via the SMBus interface and configured to carry out a boundary scan test concurrently with a built-in self-test including a burn-in test and an endurance test on the digital data storage drive via the SMBus interface during drive manufacturing, wherein the boundary scan test includes a vector test and the host tester system is configured with an inter-integrated circuit serial bus interface with bidirectional serial lines.

2. The drive tester system of claim 1, wherein the digital data storage drive is a solid state drive.

3. The drive tester system of claim 1, wherein the digital data storage drive is a hard disk drive.

4. The drive tester system of claim 1, wherein the two wire connections include a serial clock line (SCL) and a serial data line (SDA).

5. The drive tester system of claim 1, wherein the digital data storage drives includes a controller that is configured to port at least one of:
an SMBus protocol; or
an FC protocol.

6. The drive tester system of claim 5, wherein the controller includes a general purpose microcontroller.

7. The drive tester system of claim 5, wherein the controller is integrated into a system on chip (SoC) and uses one or more processors on the SoC.

8. The drive tester system of claim 1, wherein the SMBus interface does not include a universal asynchronous/transceiver (UART) or a high-speed interface (HSSI).

9. The drive tester system of claim 1, further comprising: at least one other digital data storage drive, wherein the host tester system is further configured to test the digital data storage drives in parallel over the SMBus interface.

10. A method for self-testing a digital data storage drive, the method comprising:
connecting a host tester system to the digital data storage drive via a two-wire system management bus (SMBus) interface with at least one pull-up resistor coupled to each of the two-wires and wherein the pull up resistors are configured to be driven by one of an open drain and open collector transistor output, wherein the digital storage drive includes one or more integrated circuits having at least one pair of pins connected via an interconnect and the host tester system is configured with an inter-integrated circuit serial bus interface with bidirectional serial lines; and
performing a boundary scan test on the digital data storage drive concurrently with a built-in self-test including a burn-in test and an endurance test via the two-wire SMBus interface during drive manufacturing, wherein the boundary scan test includes a vector test.

11. The method of claim 10, wherein the digital data storage drive is a solid state drive.

12. The method of claim 10, wherein the digital data storage drive is a hard disk drive.

13. The method of claim 10, wherein the two wire SMBus interface include a serial clock line (SCL) and a serial data line (SDA).

14. The method of claim 10, wherein the digital data storage drives includes a controller that is configured to port at least one of:
an SMBus protocol;
or an FC protocol.

15. The method of claim 14, wherein the controller includes a general purpose microcontroller.

16. The method of claim 14, wherein the controller is integrated into a system on chip (SoC) and uses one or more processors on the SoC.

* * * * *